United States Patent
Jeon et al.

(10) Patent No.: US 7,778,322 B2
(45) Date of Patent: Aug. 17, 2010

(54) EQUALIZER WITH OVERLAPPED FILTER BANKS AND METHODS FOR THE SAME

(75) Inventors: Hyun-bae Jeon, Seoul (KR); Do-han Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1388 days.

(21) Appl. No.: 11/201,363

(22) Filed: Aug. 11, 2005

(65) Prior Publication Data

US 2006/0088091 A1 Apr. 27, 2006

(30) Foreign Application Priority Data

Oct. 22, 2004 (KR) .................. 10-2004-0084862

(51) Int. Cl.
*H03H 7/30* (2006.01)
*H03K 5/159* (2006.01)
(52) U.S. Cl. .................. 375/232; 375/233; 375/354
(58) Field of Classification Search ............ 375/229, 375/232, 233, 234, 259, 265, 260, 240
See application file for complete search history.

(56) References Cited

U.S. PATENT DOCUMENTS

| 5,495,203 | A | * | 2/1996 | Harp et al. ........... 329/306 |
| 5,777,910 | A | | 7/1998 | Lu |
| 6,144,697 | A | * | 11/2000 | Gelfand et al. ........ 375/233 |
| 7,212,568 | B2 | * | 5/2007 | Gryska ............. 375/232 |
| 2004/0091038 | A1 | * | 5/2004 | Agazzi et al. ......... 375/233 |
| 2004/0125740 | A1 | * | 7/2004 | Gardner ............. 370/208 |
| 2007/0053420 | A1 | * | 3/2007 | Koyanagi ........... 375/232 |

FOREIGN PATENT DOCUMENTS

| KR | 10-0281390 | 11/2000 |
| KR | 2003-0090307 | 11/2003 |

* cited by examiner

*Primary Examiner*—Chieh M Fan
*Assistant Examiner*—Qutbuddin Ghulamali
(74) *Attorney, Agent, or Firm*—Harness, Dickey & Pierce, p.l.c.

(57) ABSTRACT

An equalizer, which may reduce signal distortions using overlapped filter banks and methods for the same are provided. The equalizer may include a filter circuit, and a filter control circuit. The equalizer and methods for the same may reduce distortions in filtered signals.

20 Claims, 7 Drawing Sheets

EQUALIZER WITH OVERLAPPED FILTER BANKS AND METHODS FOR THE SAME

This application claims priority under 35 U.S.C. §119 of Korean Patent Application No. 10-2004-0084862, filed on Oct. 22, 2004, in the Korean Intellectual Property Office, the contents of which are incorporated herein in its entirety by reference.

BACKGROUND OF THE INVENTION

1. Field of the Invention

Example embodiments of the present invention relate to equalizers, which may be used in communication systems, and methods for the same.

2. Description of the Conventional Art

An equalizer may a signal processor, which may be used in various types of signal transmission and receipt systems (e.g., communications, broadcasting, data storage, and/or for military purposes) and may be used to compensate for distortions of signals input to, or output from, various types of signal transmission and receipt systems. A filtering circuit, which may be an element of an equalizer, may improve the performance of a communications system, for example, by suppressing channel noise and/or distortions caused by the delay of signals input to, or output from, the communications system via one or more paths. The filtering circuit may use filtering coefficients in order to suppress channel noise and/or distortions. The values of the filtering coefficients may be determined based on channel estimation information and/or noise signals distributed over upper and/or lower frequencies of main data signals (e.g., delayed signals). The filtering coefficients corresponding to noise signals may be set to values such that they may be used for suppressing the respective noise signals.

FIG. 1 is a block diagram of a conventional equalizer 10. Referring to FIG. 1, the conventional equalizer 10 may include a filter circuit 11, a slicer 12, a coefficient generator 13, and an operation circuit 14. The filter circuit 11 may include a feedforward filter 31, a feedback filter 32, and an adder 33. The feedforward filter 31 may include filter taps F1 through FG (where G is an integer) and an adder 51. The feedback filter 32 may include filter taps P1 through PG (where G is an integer) and an adder 52. The filter taps F2 through FG and P1 through PG may include a data buffer 41, a coefficient circuit 42, and a multiplier 43. The coefficient circuit 42 may include a multiplier 44 and a coefficient buffer 45. The filter tap F1 may not include a data buffer. The operation circuit 13 may include an error calculation circuit 21 and a multiplier 22.

The coefficient generation circuit 14 may estimate channel variations based on an input data signal Din and may generate filtering coefficients Co1 through Co(2G) (where G is an integer) based on the estimated channel variations. The input data signal Din may include main data signals and noise signals. The noise signals may be delayed main data signals, which may be generated when transmitting the main data signals along multiple paths. The coefficient generation circuit 14 may generate filtering coefficients Co1 through Co(2G), which may offset the noise signals in order to suppress the noise signals. The filter taps F1 through FG of the feedforward filter 31 and the filter taps P1 through PG of the feedback filter 32 may suppress the noise signals included in the input data signal Din, for example, using the filtering coefficients Co1 through Co(2G).

A less precise channel estimation may cause abnormal filtering coefficients whose values may not be equal to zero but may be substantially close to zero to be generated in coefficient buffers of filter taps where the main data signals or the noise signals may be rarely located. Abnormal filtering coefficients may cause distortion of an output data signal Dout and/or may lower the convergence speed of the filter circuit 11. Abnormal filtering coefficients may have smaller values than normal filtering coefficients. In order to reduce the likelihood that the output data signal Dout may be distorted, conventional equalizers may indiscriminately set filtering coefficients having smaller values than a threshold value to zero. However, the channel estimation information may still be imprecise, and the location and/or magnitude of the main data signals and the noise signals may differ from the channel estimation information. On time-varying multi-paths along, which signals may variably propagate, the location and/or magnitude of the main data signals and the noise signals may often vary. For example, a main data signal may move from the filter tap F2 to the filter tap F4, and the magnitude of the main data signal may increase or decrease. The main data signals or the noise signals may move from one filter tap to another filter tap. If filtering coefficients having smaller values than a threshold value are indiscriminately set to zero, filtering coefficients of filter taps to which the main data signals may be expected to move may be falsely set to zero as well. This may considerably deteriorate filtering results obtained by the filter circuit 11.

The filtering coefficients stored in the coefficient buffers 45 of the filter taps F1 through FG and P1 through PG may be updated based on operation data S. The operation data S may be obtained by the operation circuit 13 and symbol data (not shown) of the input data signal, and the coefficient buffers 45 of the filter taps F1 through FG and P1 through PG may store the updated filtering coefficients. For example, if CN corresponds to a current filtering coefficient and CN+1 corresponds to a subsequent filtering coefficient to be updated, the subsequent filtering coefficient CN+1 may be expressed by Equation (1):

$$C_{N+1} = C_N + \mu E \cdot dx \quad (1)$$

where $\mu$ is a step size coefficient, E is error data, dx is one of the symbol data of the input data signal Di, and $\mu E$ is the same, or substantially the same, as the operation data S. The subsequent filtering coefficient CN+1 may be proportional to the step size coefficient $\mu$. As the step size coefficient $\mu$ increases, the speed of the filter circuit 11 tracking channel variations may increase, and the number of errors remained in a signal filtered by the filter circuit 11 may decrease. The step size coefficient $\mu$ may be inversely proportional to the number of filter taps currently operating in the filter circuit 11. That is, as the number of filter taps operating in the filter circuit 11 increases, the step size coefficient $\mu$ may decrease. Alternatively, the smaller the number of filter taps operates in the filter circuit 11, the larger the step size coefficient $\mu$. If all, or substantially all, of the filter taps F1 through FG and P1 through PG, in the conventional equalizer of FIG. 1, operate all, or substantially all, the time, there may be a limit in the size of the step size coefficient $\mu$. If the number of filter taps included in the filter circuit 11 is reduced to increase the step size coefficient $\mu$, the filter circuit 11 may not filter noise signals input thereto after an elongated delay period, which may considerably deteriorate the filtering performance of the filter circuit 11.

SUMMARY OF THE INVENTION

Example embodiments of the present invention (e.g., an equalizer and method for the same) may reduce distortions in filtered signals and/or may increase or decrease a step size coefficient, for example, by selectively operating coefficient buffers of overlapped filter banks.

An example embodiment of an equalizer, according to the present invention, may include a filtering circuit and a filter control circuit. The filter circuit may have an overlapped filter bank structure, store at least one of a plurality of filtering coefficients input thereto in response to a plurality of control signals, filter an input data signal in response to the at least one stored filtering coefficient, operation data, and slice symbol data, and output an output data signal. The filter control circuit may compare the filtering coefficients stored in the filter circuit with a threshold value and generate the control signals based on the comparison. The number of filtering coefficients stored in the filter circuit may increase or decrease based on a status of the control signals.

In example embodiments of the present invention, an equalizer may further include a slicer, a coefficient generation circuit, and an operation circuit. The slicer may slice the output data signal, output the sliced output data signal as the slice symbol data, and determine a voltage level of the output data signal. The coefficient generation circuit may estimate channel variation in response to the input data signal and generate the filtering coefficients and a step size coefficient based on the estimated channel variation. The operation circuit may generate the operation data based on the output data signal, the slice symbol data, and the step size coefficient.

In example embodiments of the present invention, the filter circuit may include a feedforward filter, a feedback filter, and a main adder. The feedforward filter may store at least one of the filtering coefficients in response to the control signals, filter the input data signal based on the at least one stored filtering coefficient and the operation data, and output a first filtering signal. The feedback filter may store at least one of the filtering coefficients in response to the control signals, filter the slice symbol data based on the stored filtering coefficients and the operation data, and output a second filtering signal. The main adder may add the first and second filtering signals and output the output data signal.

In example embodiments of the present invention, the feedforward filter and the feedback filter may further include a plurality of filter banks, which may at least partially overlap one another. Each of the filter banks may include independent filter taps and overlapped filter taps that may be shared by a corresponding filter bank and a filter bank adjacent to the corresponding filter bank.

In example embodiments of the present invention, the filtering coefficients may be updated based on the operation data and the input data signal or operation data and the slice symbol data, and the filter banks may perform an operation on the updated filtering coefficients and the input data signal or the updated filtering coefficients and the slice symbol data and output the operation results.

In example embodiments of the present invention, each of the independent filter taps may include a coefficient buffer, which may be enabled or disabled in response to a corresponding control signal and may store a corresponding filtering coefficient when enabled. Each of the overlapped filter taps may include a coefficient buffer, which may be enabled or disabled in response to at least one of a pair of control signals and may store a corresponding filtering coefficient when enabled.

In example embodiments of the present invention, all, or substantially all, of the coefficient buffers included in each of the filter banks may be enabled or disabled simultaneously in response to a corresponding control signal or at least one of a pair of control signals.

In example embodiments of the present invention, at least a first pair of the control signals may be applied to at least a first set of two groups of independent filer taps of two adjacent filter banks that share a group of overlapped filter taps.

In example embodiments of the present invention, the filter control circuit may further include at least a first and a second filter control circuits, which may compare stored filtering coefficients with a threshold value and generate at least a first and second control signal based on the comparison results.

In example embodiments of the present invention, the first filter control circuit may compare at least a first portion of the stored filtering coefficients with a threshold value and the second filter control circuit may compares at least a second portion of the stored filtering coefficients with the threshold value.

In example embodiments of the present invention, the first filter control circuit may include a plurality of bank control circuits, which may compare at least a first portion of the stored filtering coefficients with a threshold value. The second filter control circuit may include a plurality of bank control circuits, which may compare at least a second portion of the stored filtering coefficients with the threshold value.

In example embodiments of the present invention, if at least one of the stored filtering coefficients is larger than the threshold value, a bank control circuit may enable a corresponding control signal so that all, or substantially all, of the coefficient buffers included in a corresponding filter bank may be enabled simultaneously.

In example embodiments of the present invention, each of the bank control circuits may include a first multiplexer, a comparator, and an output circuit. The first multiplexer may output the stored filtering coefficients stored in each of the filter banks in response to a coefficient selection signal. The comparator may compare the filtering coefficients received from the first multiplexer with the threshold value and outputs comparison signals. The output circuit may add the comparison signals and outputs the corresponding control signal in response to an output selection signal.

In example embodiments of the present invention, the output circuit may include a second multiplexer, a first and second buffer, and an adder. The second multiplexer may select one of a flag signal and a first buffer signal in response to the output selection signal and may output the selected signal as the corresponding first control signal. The first buffer may store the selected signal output from the second multiplexer and may output the stored signal as the first buffer signal. The adder may add the comparison signals and a second buffer signal and may output the sum as the flag signal. The second buffer may store the flag signal and outputs the stored flag signal as the second buffer signal.

In example embodiments of the present invention, if the output selection signal is disabled, the second multiplexer may select the first buffer signal and may output the selected first buffer signal as the corresponding control signal. If the output selection signal is enabled, the second multiplexer may select the flag signal and may output the selected flag signal as the corresponding control signal. If the first multiplexer outputs all, or substantially all, of the filtering coefficients stored in the coefficient buffers of the corresponding filter bank, the output selection signal may be enabled.

In example embodiments of the present invention, each of the bank control circuits may include comparators and an output circuit. The comparators may compare the stored filtering coefficients with the threshold value and may output a plurality of comparison signals. The output circuit may output the corresponding control signal in response to the comparison signals.

In example embodiments of the present invention, each of the comparators may enable a corresponding comparison signal if one of the stored filtering coefficients is larger than the threshold value. The output circuit may include a selector, which may enable a corresponding control signal if at least one of the comparison signals is enabled, and all, or substantially all, of the coefficient buffers of the corresponding filter bank may be enabled simultaneously if the corresponding control signal is enabled.

In example embodiments of the present invention, the first and second filter control circuits may include a plurality of bank control circuits and a plurality of selectors. The plurality of bank control circuits may compare the filtering coefficients stored in the buffers of each of the filter banks with the threshold value and output comparison signals. The plurality of selectors may output the control signals in response to the comparison signals and control signals.

In example embodiments of the present invention, the control signals may be generated based on channel estimation information, which may be obtained by an external channel estimation apparatus based on the input data signal.

Another example embodiment of the present invention provides an equalization method. An equalization method, according to an example embodiment of the present invention, may include storing at least one of a plurality of filtering coefficients input to a filtering circuit in response to at least one control signal; filtering an input data signal in response to the at least one stored filtering coefficient, operation data, and slice symbol data; and outputting an output data signal. In example embodiments of the equalization method, the control signals may be generated based on a comparison of the stored filtering coefficients and a threshold value, and the number of filtering coefficients stored may increased or decreased based on a status of the control signals.

In another example embodiment of the present invention, a filter control circuit may include a plurality of bank control circuits and a plurality of selectors. The plurality of bank control circuits may compare filtering coefficients stored in buffers associated with each of a plurality of filter banks with a threshold value and output comparison signals. The plurality of first selectors may output control signals in response to the comparison signals and the control signals.

In another example embodiment of the present invention, a bank control circuit may include a first multiplexer, a comparator, and an output circuit. The first multiplexer may output stored filtering coefficients stored in each of a plurality of filter banks in response to a coefficient selection signal. The comparator may compare the filtering coefficients received from the first multiplexer with a threshold value and outputs comparison signals. The output circuit may add the comparison signals and may output a corresponding control signal in response to an output selection signal.

BRIEF DESCRIPTION OF THE DRAWINGS

Example embodiments of the present invention will now be described with reference to the attached drawings in which.

DETAILED DESCRIPTION OF THE EXAMPLE EMBODIMENTS OF THE PRESENT INVENTION

Figure 1:
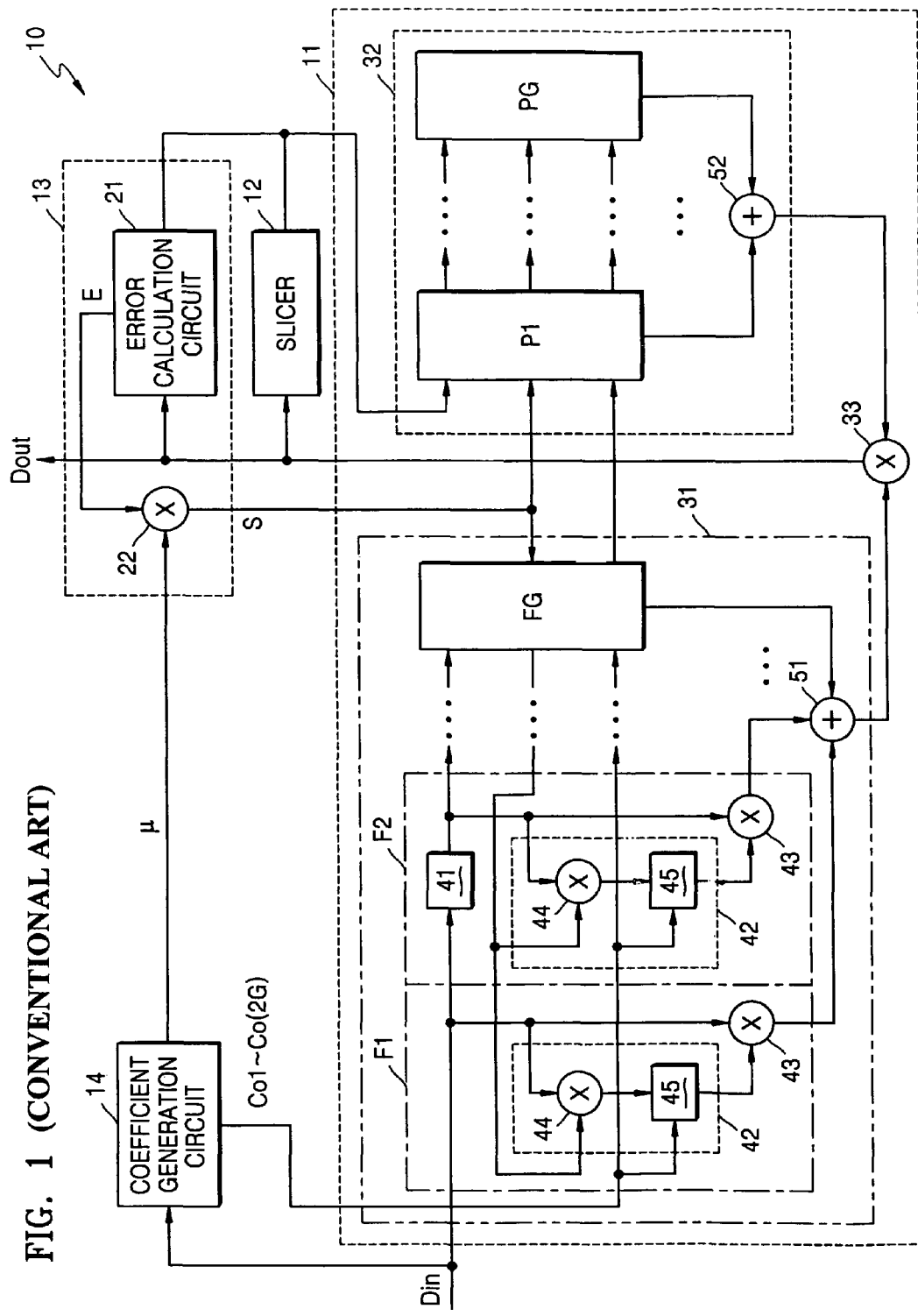
FIG. 1 is a block diagram of a conventional equalizer.

Example embodiments of the present invention will now be described more fully with reference to the accompanying drawings in which example embodiments of the present invention are shown. In the drawings, like reference numerals represent like elements.

Figure 2:
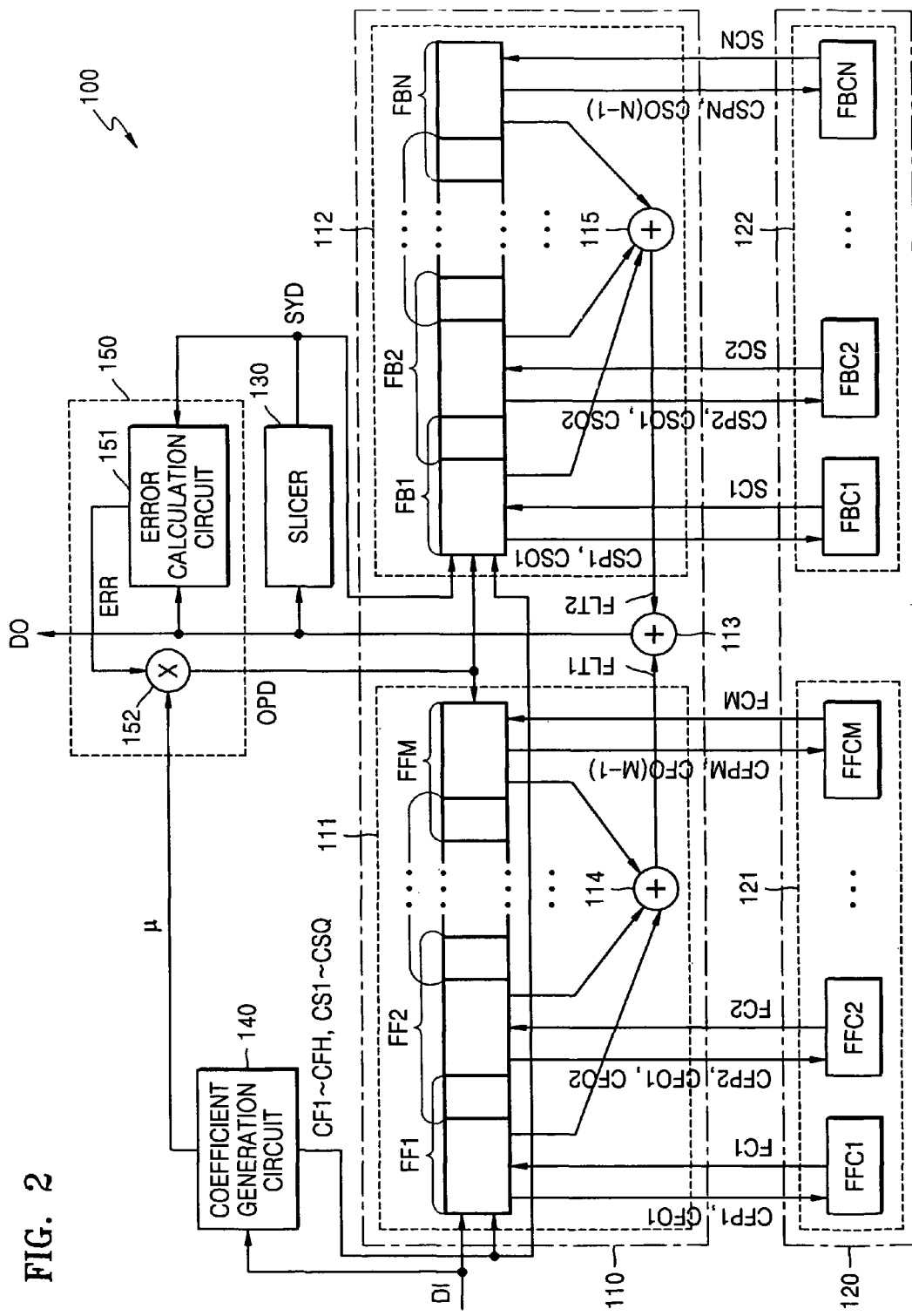
FIG. 2 is a block diagram of an equalizer, according to an example embodiment of the present invention.

FIG. 2 is a block diagram of an equalizer 100 according to an example embodiment of the present invention. Referring to FIG. 2, the equalizer 100 may include a filter circuit 110, a filter control circuit 120, a slicer 130, a coefficient generation circuit 140, and an operation circuit 150. The filter circuit 110 may include a feedforward filter 111, a feedback filter 112, and a main adder 113. The feedforward filter 111 may include forward filter banks FF1 through FFM (where M is an integer) and a first sub-adder 114. The forward filter banks FF1 through FFM may at least partially overlap one another. The forward filter banks FF1 through FFM may filter an input data signal DI, for example, using first filtering coefficients CFP1 through CFPM and CFO1 through CFO(M−1) (where M is an integer), which may be updated based on first filtering coefficients CF1 through CFH (where H is an integer), operation data OPD, and the input data signal DI. The forward filter banks FF1 through FFM may determine whether to store the first filtering coefficients CFP1 through CFPM and CFO1 through CFO(M−1) in response to first control signals FC1 through FCM (where M is an integer). The feedforward filter 111 may store at least a portion (e.g., at least one, some, or all) of the first filtering coefficients CFP1 through CFPM and CFO1 through CFO(M−1). The first sub-adder 114 may add signals output from the forward filter banks FF1 through FFM and may output a first filtering signal FLT1 as the sum.

The feedback filter 112 may include feedback filter banks FB1 through FBN (where N is an integer) and a second sub-adder 115. The feedback filter banks FB1 through FBN may at least partially overlap one another. The feedback filter banks FB1 through FBN may filter slice symbol data SYD using second filtering coefficients CSP1 through CSPN and CSO1 through CSO(N−1) (where N is an integer), which may be updated based on second filtering coefficients CS1 through CSQ (where Q is an integer), the operation data OPD, and the slice symbol data SYD. The feedback filter banks FB1 through FBN may determine whether to store the second filtering coefficients CSP1 through CSPN and CSO1 through CSO(N−1) in response to second filter control signals SC1 through SCN (where N is an integer). The feedback filter 112 may store at least a portion (e.g., at least one, some, or all) of the second filtering coefficients CSP1 through CSPN and CSO1 through CSO(N−1). The second sub-adder 115 may add signals output from the feedback filter banks FB1 through FBN and may output a second filtering signal FLT2 as the sum. The main adder 113 may add the first and second filtering signals FLT1 and FLT2 and may output data DO as the sum.

The filter control circuit 120 may include a first filter controller 121 and a second filter controller 122. The first filter controller 121 may include a plurality of first bank control circuits FFC1 through FFCM (where M is an integer). The first bank control circuits FFC1 through FFCM may receive the first filtering coefficients CFP1 through CFPM and CFO1 through CFO(M−1) from the forward filter banks FF1 through FFM. The first bank control circuits FFC1 through FFCM may compare (e.g., periodically compare) the first filtering coefficients CFP1 through CFPM and CFO1 through CFO(M−1) with a threshold value and may output the first filter control signals FC1 through FCM, for example, based on the comparison. The second filter controller 122 may include a plurality of second bank control circuits FBC1 through FBCN (where N is an integer). The second bank control circuits FBC1 through FBCN may receive the second filtering coefficients CSP1 through CSPN and CSO1 through CSO(N−1) from the feedback filter banks FB1 through FBN. The second bank control circuits FBC1 through FBCN may compare (e.g., periodically compare) the second filtering coefficients CSP1 through CSPN and CSO1 through CSO(N−1) with the threshold value and may output the second filter control signals SC1 through SCN, for example, based on the comparison.

The slicer 130 may slice the output data signal DO and output the slice symbol data SYD to determine the voltage level of the output data signal DO. The coefficient generation circuit 140 may estimate channel variations based on the input data signal DI and may generate the first and second filtering coefficients CF1 through CFH and CS1 through CSQ and the step size coefficient μ. The operation circuit 150 may further include an error calculator 151 and a multiplier 152. The error calculator 151 may calculate an error based on the output data signal DO and the slice symbol data SYD and may output error data ERR. The multiplier 152 may multiply the error data ERR by the step size coefficient 11 and may output the operation data OPD as the product.

The structures and/or operations of the forward filter banks FF1 through FFM, the feedback filter banks FB1 through FBN, the first bank control circuits FFC1 through FFCM, and the second bank control circuits FBC1 through FBCN will be described in detail below. The structure and/or operation of the forward filter banks FF1 through FFM may be similar, or substantially similar, to the structure and/or operation of the feedback filter banks FB1 through FBN. The structure and/or operation of the first bank control circuits FFC1 through FFCM may be similar, or substantially similar, to the structure and operation of the second bank control circuits FBC1 through FBCN. Thus, only the structures and operations of the forward filter banks and the first bank control circuits will be described herein.

Figure 3:
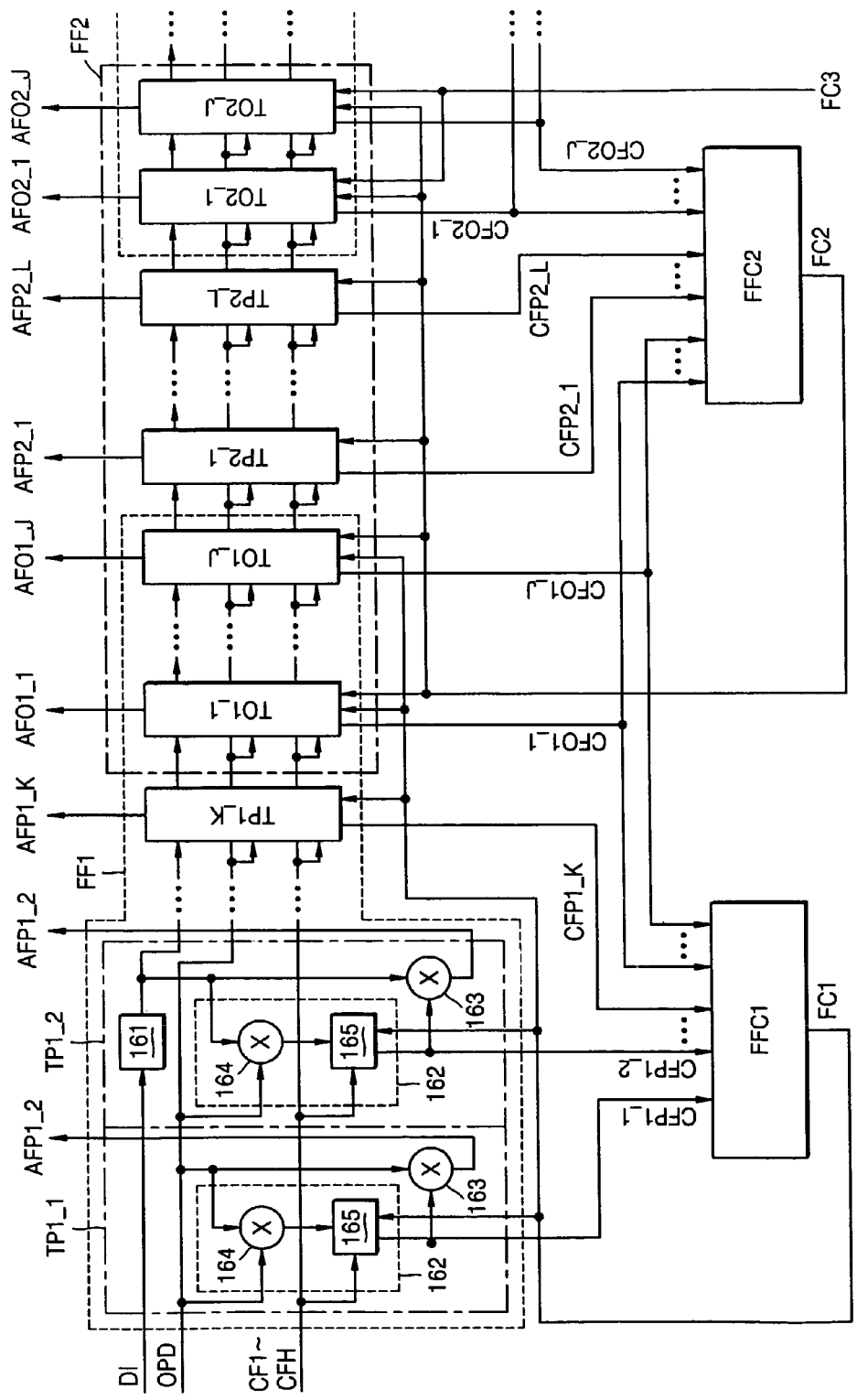
FIG. 3 is a block diagram illustrating filter banks and first bank control circuits, according to an example embodiment of the present invention.

FIG. 3 is a block diagram illustrating the forward filter banks FF1 and FF2 and the first bank control circuits FFC1 and FFC2, for example, as illustrated in FIG. 2. Referring to FIG. 3, the forward filter bank FF1 may include independent filter taps TP1_1 through TP1_K (where K is an integer) and overlapped filter taps TO1_1 through TO1_J (where J is an integer). The forward filter bank FF2 may include independent filter taps TP2_1 through TP2_L (where L is an integer), the overlapped filter taps TO1_1 through TO1_J, and overlapped filter taps TO2_1 through TO2_J. The forward filter banks FF1 and FF2, which may be adjacent to one other, may share the overlapped filter taps TO1_through TO1_J. The overlapped filter taps TO2_1 through TO2_J may be shared by the forward filter banks FF2 and FF3.

The independent filter tap TP1_1 may include a coefficient circuit 162 and a multiplier 163. Each of the independent filter taps TP1_2 through TP1_K and TP2_1 through TP2_L and the overlapped filter taps TO1_1 through TO1_J and TO2_1 through TO2_J may include a data buffer 161, a coefficient circuit 162, and a multiplier 163. The data buffer 161 of each of the independent filter taps TP1_2 through TP1_K and TP2_1 through TP2_L and the overlapped filter taps TO1_1 through TO1_J and TO2_1 through TO2_J may store at least one of the symbol data (of the input data signal DI) and may output the stored symbol data. The coefficient circuit 162 of each of the independent filter taps TP1_1 through TP1_K and TP2_1 through TP2_L and the overlapped filter taps TO1_1 through TO1_J and TO2_1 through TO2_J may perform an operation on the operation data OPD and the symbol data received from a corresponding data buffer 161 and may output the result. All, or substantially all, of the coefficient buffers 165 included in the forward filter bank FF1 may be enabled or disabled, for example, simultaneously, in response to the first filter control signal FC1. For example, if the first filter control signal FC1 is enabled, all, or substantially all, of the coefficient buffers 165 included in the forward filter bank FF1 may be enabled. If the first filter control signal FC1 is disabled, all, or substantially all, of the coefficient buffers 165 included in the forward filter bank FF1 may be disabled.

All, or substantially all, of the coefficient buffers 165 included in the forward filter bank FF2 may be enabled or disabled, for example, simultaneously, in response to the first filter control signal FC2. For example, if the first filter control signal FC2 is enabled, all, or substantially all, of the coefficient buffers 165 included in the forward filter bank FF2 may be enabled. If the first filter control signal FC2 is disabled, all, or substantially all, of the coefficient buffers 165 included in the forward filter bank FF2 may be disabled. All, or substantially all, of the coefficient buffers 165 of the overlapped filter taps TO1_1 through TO1_J, which may be shared by the forward filter banks FF1 and FF2 may be enabled, for example, when one of the first filter control signals FC1 and FC2 is enabled. When enabled, the coefficient buffer 165 of the independent filter tap TP_1 may store the first filtering coefficient CF1, may update the first filtering coefficient CF1 based on a signal output from the multiplier 164 of the independent filter tap TP1_1, and may store the updated first filtering coefficient, e.g., a first filtering coefficient CFP1_1. The multiplier 163 of the independent filter tap TP1_1 may multiply at least one of the symbol data (of the input data signal DI) by the filtering coefficient CFP1_1 received from the coefficient buffer 165 of the independent filter tap TP1_1. The coefficient buffers 165 of the independent filter taps TP1_2 through TP1_K and TP2_1 through TP1_L and the overlapped filter taps TO1_1 through TO1_J and TO2_1 and TO2_J may operate in the same, or substantially the same, manner as the coefficient buffer 165 of the independent filter tap TP1_1.

The first bank control circuit FFC1 may compare (e.g., periodically compare) the first filtering coefficients CFP1_1 through CFP1_K and CFO1_1 through CFO1_J received from the independent filter taps TP1_1 through TP1_K and the overlapped filter taps TO1_1 through TO1_J with the threshold value and may output the first filter control signal FC1 based on the comparison. For example, if at least one of the first filtering coefficients CFP1_1 through CFP1_K and CFO1_1 through CFO1_J is greater than, or equal to, the threshold value, the first bank control circuit FFC1 may enable the first filter control signal FC1. If all, or substantially all, of the first filtering coefficients CFP1_1 through CFP1_K and CFO1_1 through CFO1_J are less than the threshold value, the first bank control circuit FFC1 may disable the first filter control signal FC1. When at least one of the first filtering coefficients CFP1_1 through CFP1_K and CFO1_1 through CFO1_J is greater than, or equal to, the threshold value, the forward filter bank FF1 may store a main data signal. When all, or substantially all, of the first filtering coefficients CFP1_1 through CFP1_K and CFO1_1 through CFO1_J are less than the threshold value, the forward filter bank FF1 may not store a main data signal. If the forward filter bank FF1 stores a main data signal, the coefficient buffers 165 of all, or substantially all, of the filter taps TP1_1 through TP1_K and TO1_1 through TO1_J in the forward filter bank FF1 may be enabled, and the location and/or magnitude of the main data signal may not vary due to, for example, channel variations. The first bank control circuit FFC2 may compare (e.g., periodically compare) the first filtering coefficients CFP2_1 through CFP2_L, CFO1_1 through CFO1_J, and CFO2_1 through CFO2_J with the threshold value and may output the first filter control signal FC2 based on the comparison. The operation of the first bank control circuit FFC2 may be similar, or substantially similar, to the operation of the first bank control circuit FFC1.

If the first filter control signal FC1 is enabled and the second filter control signal FC2 is disabled, the coefficient buffers 165 of the independent filter taps TP1_1 through TP1_K and the overlapped filter taps TO1_1 through TO1_J may be enabled, and the coefficient buffers 165 of the independent filter taps TP2_1 through TP2_L and the overlapped filter taps TO2_1 through TO2_J may be disabled. The independent filter taps TP1_1 through TP1_K and the overlapped filter taps TO1_1 through TO1_J may update the first filtering coefficients CFP1_1 through CFP1_K and CFO1_1 through CFO1_J, respectively, and may store the updated results. The first bank control circuit FFC1 may compare (e.g., periodically compare) the first filtering coefficients CFP1_1 through CFP1_K and CFO1_1 through CFO1_J with the threshold value. The overlapped filter taps TO1_1 through TO1_J may be enabled, and the first bank control circuit FFC2 may compare (e.g., periodically compare) the first filtering coefficients CFO1_1 through CFO1_J with the threshold value.

For example, if a main data signal (or a noise signal) transitions from the independent filter tap TP1_K to the overlapped filter tap TO1_1 due to channel variations, the first filtering coefficient CFO1_1 stored in the coefficient buffer 165 of the overlapped filter tap TO1_1 may become greater than, or equal to, the threshold value. The first bank control circuit FFC2 may enable the second filter control signal FC2, and the first bank control circuit FFC1 may maintain the first filter control signal FC1 to be enabled. All, or substantially all, of the coefficient buffers 165 included in each of the forward filter banks FF1 and FF2 may be enabled. If the main data signal (or the noise signal) transitions to one of the independent filter taps TP2_1 through TP2_L of the forward filter bank FF2, the input data signal DI may be filtered, for example, without resultant signal distortions. The equalizer 100 may have an overlapped filter bank structure, and may enable (e.g., selectively enable) the coefficient buffers 165 of each of the forward filter taps FF1 through FFM and may increase or decrease the step size coefficient μ based on the number of coefficient buffers 165, which may be currently enabled.

As described above, adjacent forward filter banks in the equalizer 100 may share filter taps, which may at least partially overlap one another, and the performance of the equalizer 100 may improve. For example, the forward filter banks FF1 and FF2 may include the independent filter taps TP1_1 through TP1_K and the independent filter taps TP2_1 through TP2_L, respectively, and may not share the overlapped filter taps TO1_1 through TO1_J. If the coefficient buffers 165 of the forward filter bank FF1 are enabled and the coefficient buffers 165 of the forward filter bank FF2 are disabled, a main data signal (or a noise signal) may be more likely to transition from the forward filter bank FF1 to the forward filter bank FF2, for example, in a multi-path channel with longer delay time. Even though the main data signal (or the noise signal) may exist in the forward filter bank FF2, signals output from the coefficient buffers 165 of the forward filter bank FF2 may be maintained at zero, or substantially zero, which may be interpreted as distortions in filtered signals.

The structure and operation of the first bank control circuits FFC1 and FFC2 will be described in detail below. The first bank control circuits FFC1 and FFC2 may have the same or substantially the same, structure and/or operation, and as such, only the first bank control circuit FFC2 will be described below.

Figure 4:
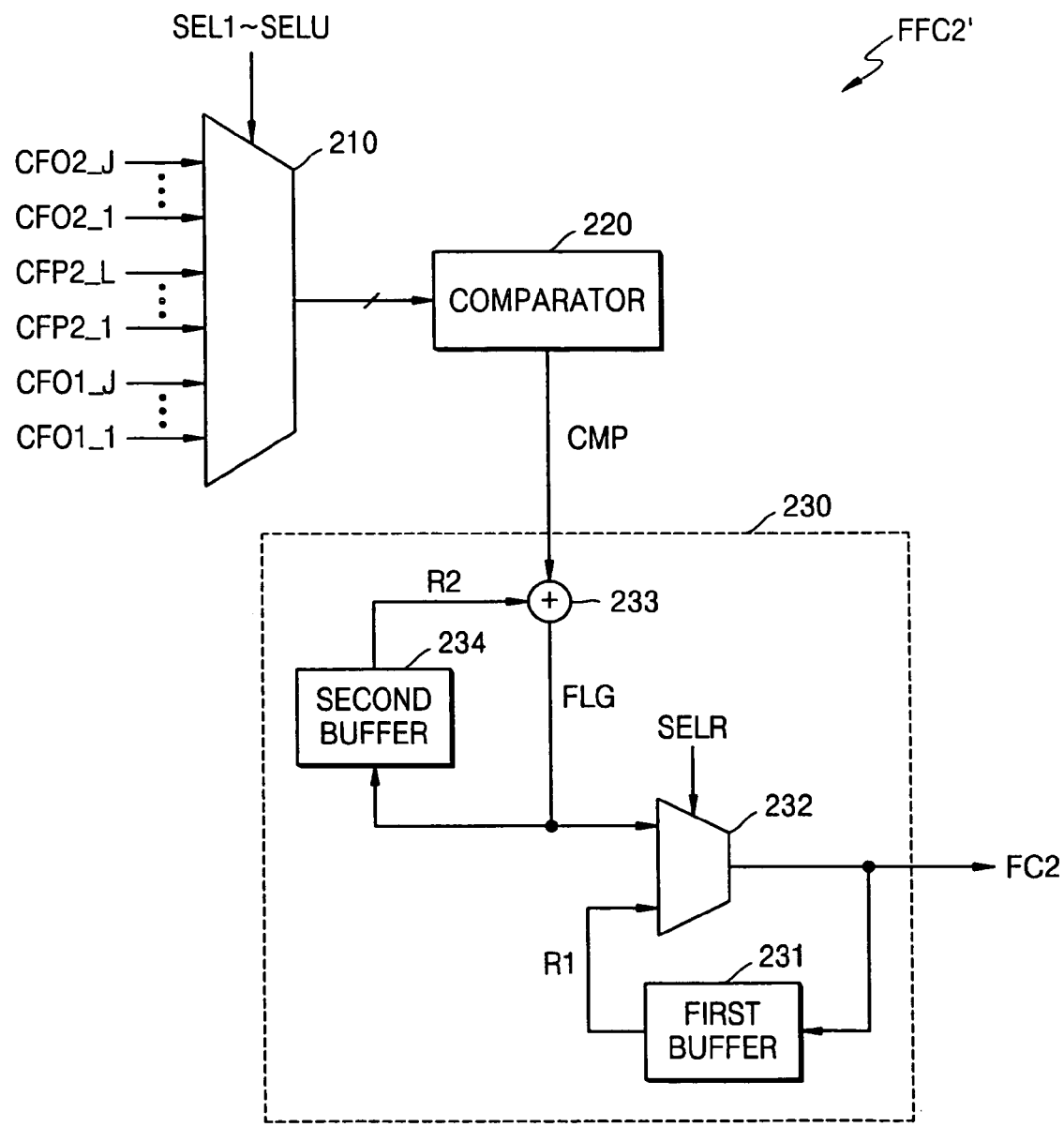
FIG. 4 is a block diagram of an example of a bank control circuit, according to another example embodiment of the present invention.

FIG. 4 is a block diagram of an example of a first control circuit FFC2' (e.g., which may be the same, or substantially the same, as the first control circuit FFC2 as illustrated in FIG. 2), according to an example embodiment of the present invention. Referring to FIG. 4, the first bank control circuit FFC2' may include a first multiplexer 210, a comparator 220, and an output circuit 230. The first multiplexer 210 may output the first filtering coefficients CFO1_1 through CFO1_J, CFP2_1 through CFP2_L, and CFO2_1 through CFO2_J, for example, sequentially in response to coefficient signals SEL1 through SELU (where U is an integer that satisfies the following equation: U=2J+L). The comparator 220 may compare the first filtering coefficients CFO1_1 through CFO1_J, CFP2_1 through CFP2_L, and CFO2_1 received from the first multiplexer 210 with the threshold value and may output a comparison signal CMP. The output circuit 230 may include a first buffer 231, a second multiplexer 232, an adder 233, and a second buffer 234. The first buffer 231 may store a signal output from the second multiplexer 232 and may output a first buffer signal R1. The second multiplexer 232 may select one of the first buffer signal R1 and a flag signal FLG in response to an output selection signal SELR and may output the selected signal as the first filter control signal FC2. If the output selection signal SELR is enabled, the second multiplexer 232 may select the flag signal FLG. Alternatively, the second multiplexer 232 may select the first buffer signal R1. For example, the output selection signal SELR may be enabled when the first multiplexer 210 outputs all, or substantially all, of the first filtering coefficients CFO1_1 through CFO1_J, CFP2_1 through CFP2_L, and CFO2_1 through CFO2_J. The comparator 220 may compare each of the first filtering coefficients CFO1_1 through CFO1_J, CFP2_1 through CFP2_L, and CFO2_1 through CFO2_J with the threshold value and may output the comparison results as the first filter control signal FC2. The adder 233 may add the comparison signal CMP and a second buffer signal R2 and may output the flag signal FLG. The second buffer 234 may store the flag signal FLG and may output the stored flag signal FLG as the second buffer signal R2. Accordingly, the flag signal FLG may be equal, or substantially equal, to the sum of the comparison results obtained by the comparator 220. If at least one of the first filtering coefficients CFO1_1 through CFO1_J, CFP2_1 through CFP2_L, and CFO2_1 through CFO2_J is greater than, or equal to, the threshold value, the flag signal FLG may be set to a higher logic value (e.g., a logic value of "H" or "1"). If all, or substantially all, of the first filtering coefficients CFO1_1 through CFO1_J, CFP2_1 through CFP2_L, and CFO2_1 through CFO2_J are less than the threshold value, the flag signal FLG may be set to a lower logic value (e.g., a logic value of "L" or "0"). The first bank control circuit FFC2' may use one comparator (e.g., the comparator 220) to determine whether the first filtering coefficients CFO1_1 through CFO1_J, CFP2_1 through CFP2_L, and CFO2_1 through CFO2_J are greater than, or equal to, the threshold value, and may contribute to the reduction of chip size and/or power consumption.

Figure 5:
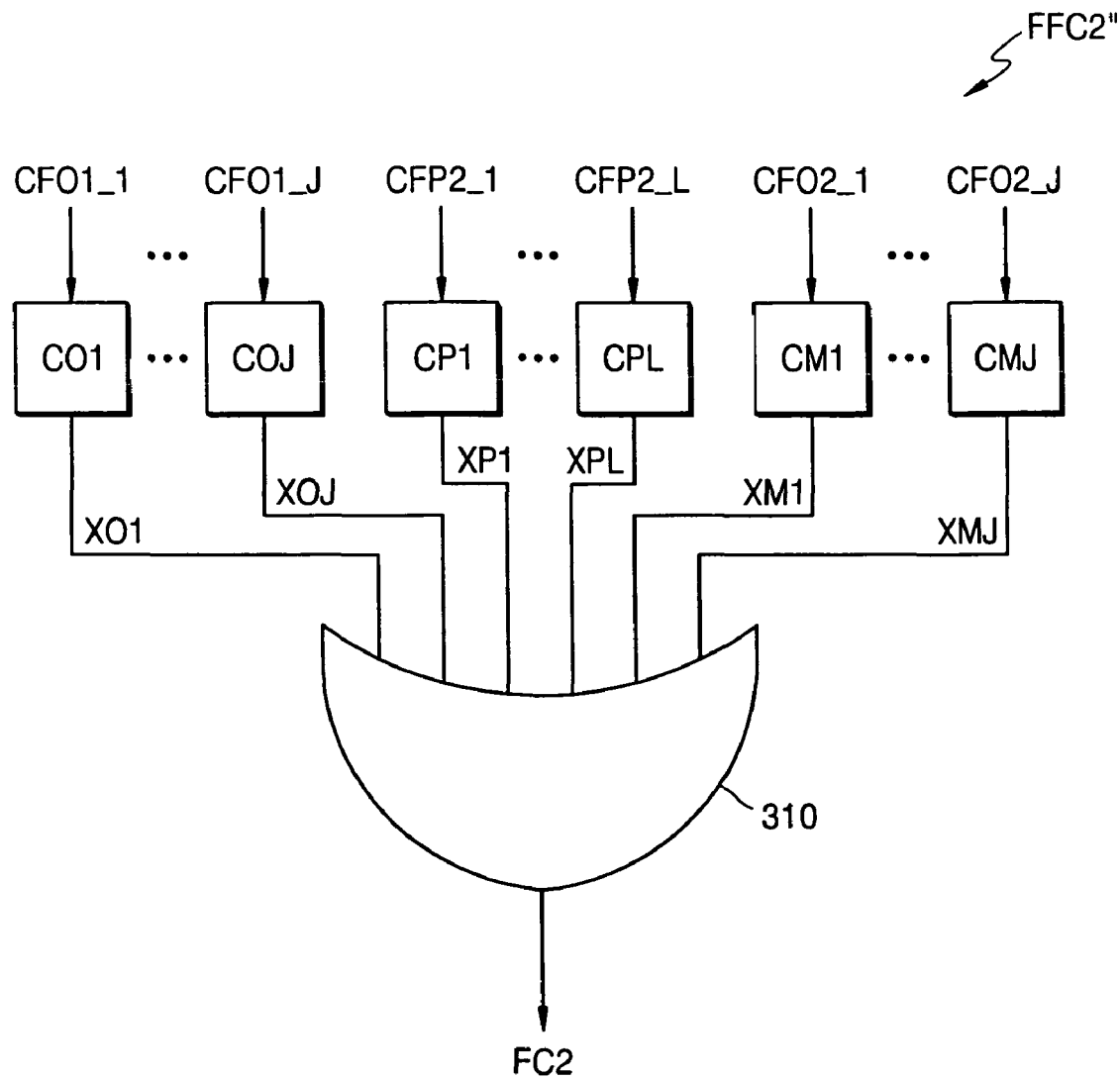
FIG. 5 is a block diagram of an example of the bank control circuit, according to another example embodiment of the present invention.

FIG. 5 is a block diagram of another example of the first bank control circuit a first bank control circuit FFC2" (e.g., which may be the same or substantially the same as the FFC2 of FIG. 2), according to another example embodiment of the present invention. Referring to FIG. 5, the first bank control circuit FFC2" may include a plurality of comparators CO1 through COJ, CP1 through CPL, and CM1 through CMJ and an OR gate (or selector) 310. The comparators CO1 through COJ, CP1 through CPL, and CM1 through CMJ may compare (e.g., periodically compare) the first filtering coefficients CFO1_L through CFO1_J, CFP2_1 through CFP2_L, and CFO2_1 through CFO2_J, respectively, with the threshold value and may output comparison signals XO1 through XOJ, XP1 through XPL, and XM1 through XMJ, respectively, based on the comparison results. For example, if the first filtering coefficients CFO1_1 through CFO1_J, CFP2_1 through CFP2_L, and CFO2_1 through CFO2_J are greater than, or equal to, the threshold value, the comparators CO1 through COJ, CP1 through CPL, and CM1 through CMJ may enable the comparison signals XO1 through XOJ, XP1 through XPL, and XM1 through XMJ, respectively. The OR gate 310 may output the first filter control signal FC2 in response to the comparison signals XO1 through XOJ, XP1 through XPL, and XM1 through XMJ. For example, the OR gate 310 may enable the first filter control signal FC2, for example, when at least one of the comparison signals XO1 through XOJ, XP1 through XPL, and XM1 through XMJ is enabled. Each of the comparison signals XO1 through XOJ, XP1 through XPL, and XM1 through XMJ may be comprised of one bit, and each of the first filtering coefficients CFO1_1 through CFO1_J, CFP2_1 through CFP2_L, and CFO2_1 through CFO2_J may be comprised of a plurality of bits.

As described above, the first bank control circuit FFC2" may output a result of an OR operation performed on the comparison results obtained by the comparators CO1 through COJ, CP1 through CPL, and CM1 through CMJ as the first filter control signal FC2 using the OR gate 310. The first bank control circuit FFC2" may consume less power than the first bank control circuit FFC2' of FIG. 4.

Figure 6:
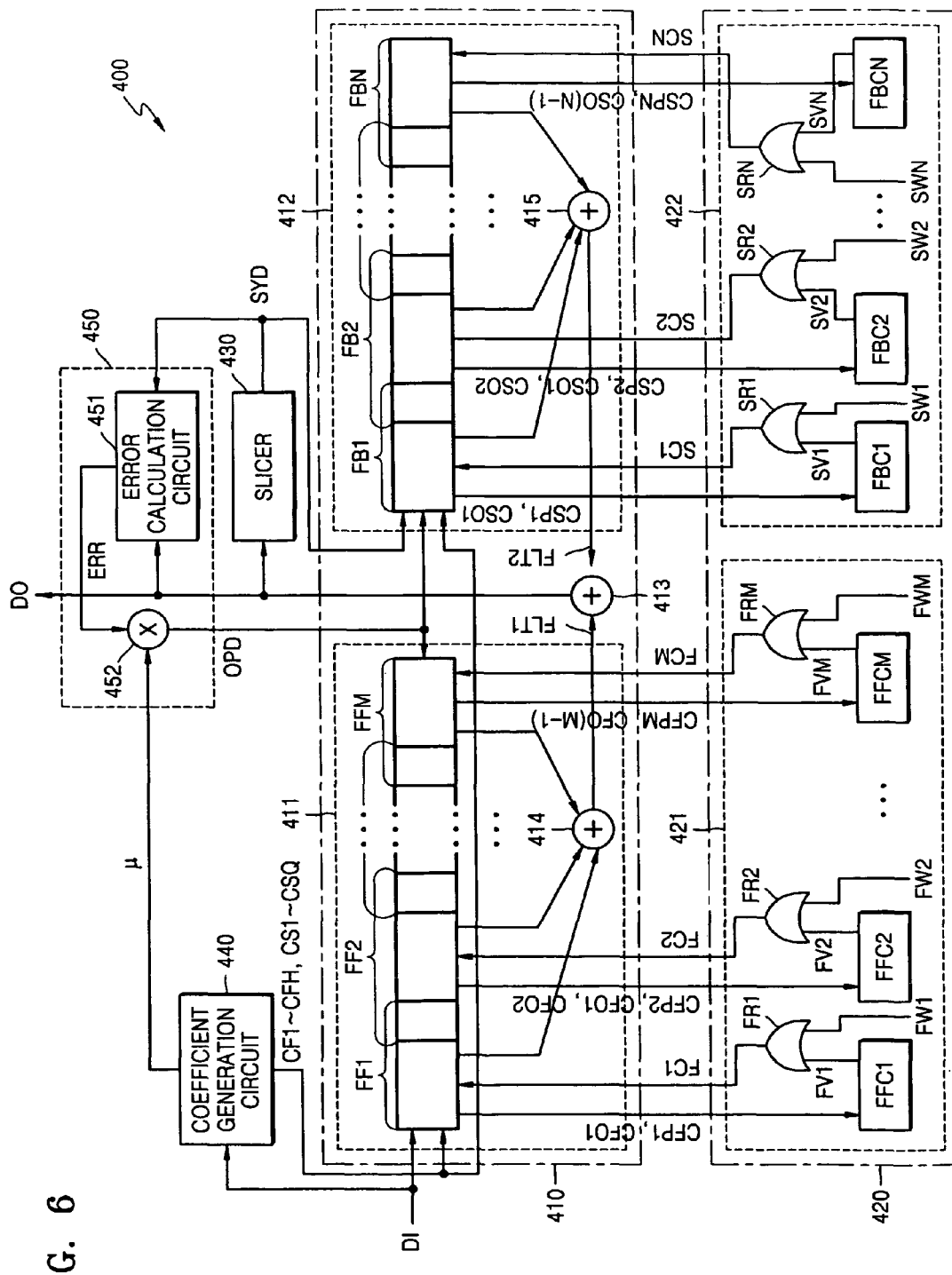
FIG. 6 is a block diagram of an equalizer, according to another example embodiment of the present invention.

FIG. 6 is a block diagram of an equalizer 400, according to another example embodiment of the present invention. Referring to FIG. 6, the equalizer 400 may include a filter circuit 410, a filter control circuit 420, a slicer 430, a coefficient generation circuit 440, and an operation circuit 450. The filter circuit 410 may include a feedforward filter 411, a feedback filter 412, and a main adder 413. The filter control circuit 420 may include a first filter control circuit 421 and a second filter control circuit 422. The structure and/or operation of the equalizer 400 may be the same, or substantially the same, as the structure and/or operation of the equalizer 100 of FIG. 2 except for the first and second filter control circuits 421 and 422.

The first filter control circuit 421 may include a plurality of first bank control circuits FFC1 through FFCM (where M is an integer) and a plurality of first OR gates FR1 through FRM. The first bank control circuits FFC1 through FFCM may compare (e.g., periodically compare) first filtering coefficients CFP1 through CFPM and CFO1 through CFO(M-1) received from a plurality of forward filter banks FF1 through FFM with a threshold value and may output comparison signals FV1 through FVM, respectively, based on the comparison. The first OR gates FR1 through FRM may enable the first filter control signals FC1 through FCM, respectively, for example, if one or more of the comparison signals FV1 through FVM or one of a plurality of control signals FW1 through FWM is enabled.

The second filter control circuit 422 may include a plurality of second bank control circuits FBC1 through FBCN (where N is an integer) and a plurality of second OR gates. The second bank control circuits FBC1 through FBCN may compare (e.g., periodically compare) second filtering coefficients CSP1 through CSPN and CSO1 through CSO(N-1) received from a plurality of feedback filters FB1 through FBN with the threshold value and may output comparison signals SV1 through SVN, respectively, based on the comparison. The second OR gates SR1 through SRN may output second filter control signals SC1 through SCN, respectively, in response to the comparison signals SV1 through SVN and a plurality of control signals SW1 through SWN. The second OR gates SR1 through SRN may enable the second filter control signals SC1 through SCN, respectively, for example, when one or more of the comparison signals SV1 through SVN and/or one or more of the control signals SW1 through WN is enabled. The control signals FW1 through FWM and SW1 through SWN may be generated by an external channel estimation apparatus. For example, the external channel estimation apparatus may estimate channel variations, for example, using a pseudo noise (PN) correlation method, a least square (LS) method, or any other, suitable method for estimating channel variations. For example, in the pseudo noise correlation method, a channel estimation operation may be performed based on code information included in an input data signal DI. In the least square method, a channel estimation operation may be performed based on calculations.

Figure 7:
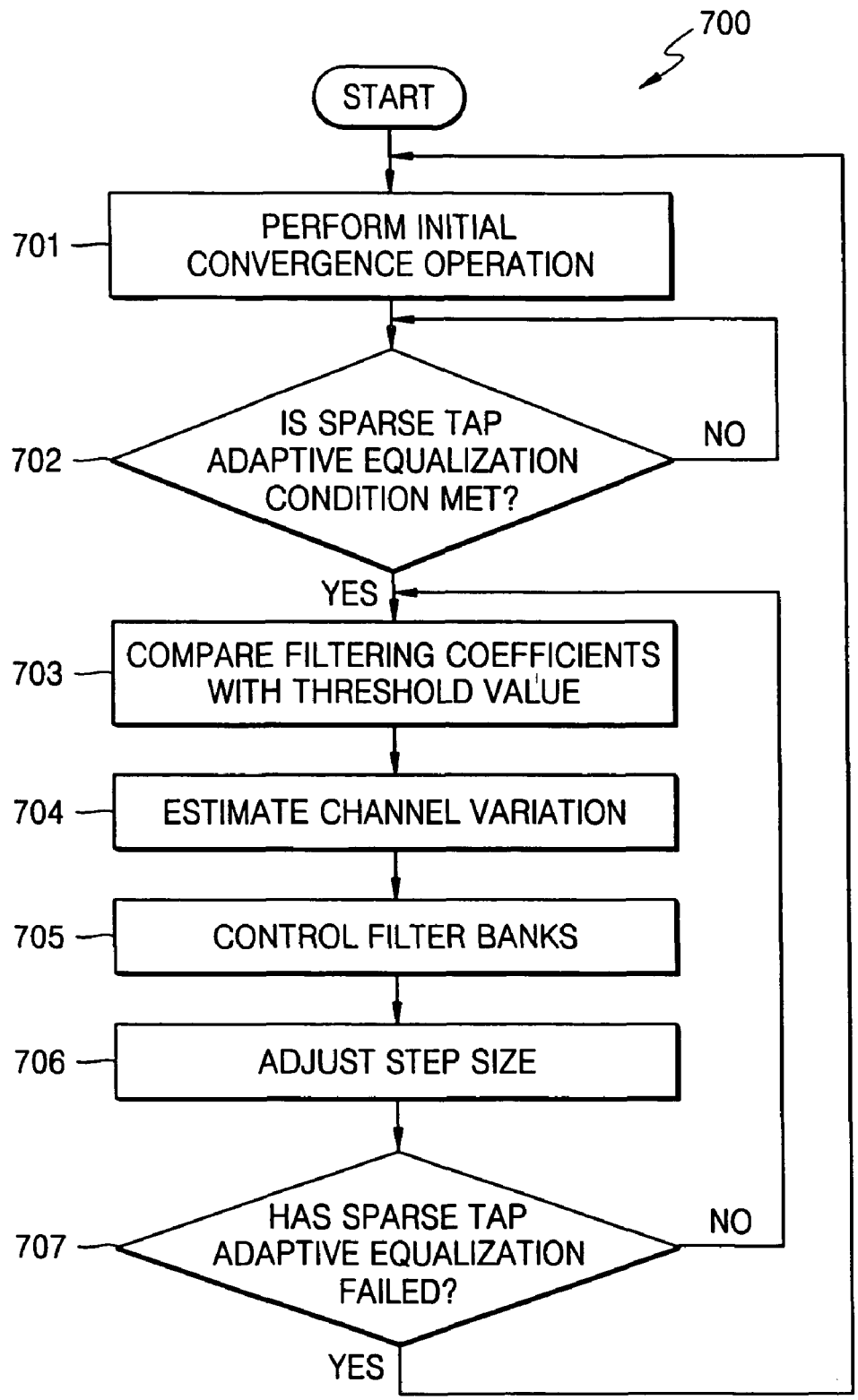
FIG. 7 is a flowchart illustrating a method, which may be performed by an equalizer, according to example embodiments of the present invention.

FIG. 7 is a flowchart of a method, which may be performed in an equalizer according to an example embodiment of the present invention. Referring to FIG. 7, at 701, all, or substantially all, of the first filter control signals FC1 through FCM and second filter control signals SC1 through SCN may be enabled, and all, or substantially all, of the coefficient buffers of forward filter banks FF1 through FFM and coefficient buffers 165 of feedback filter banks FB1 through FBN may be enabled. The forward filter banks FF1 through FFM and the feedback filter banks FB1 through FBN may perform an initial convergence operation based on first filtering coefficients CF1 through CFH and second filtering coefficients CS1 through CSQ. At 702, a determination may be made as to whether an equalization condition (e.g., sparse tap adaptive equalization condition) may currently be met. The equalization condition may concern a time instant, a period of time, a voltage level, and a data size, which may be set. For example, the time instant may pass, and if an input data signal DI has reached the voltage level, and/or if symbol data has the data size, it may be determined that the equalization condition has been met. At 703, first bank control circuits FFC1 through FFCM may compare first filtering coefficients CFP1 through CFPM and CFO1 through CFO(M-1) received from the forward filter banks FF1 through FFM with a threshold value and may output comparison signals FV1 through FVM, respectively, and second bank control circuits FBC1 through FBCN may compare second filtering coefficients CSP1 through CSPN and CSO1 through CSO(N-1) with the threshold value and may output comparison signals SV1 through SVM, respectively. At 704, the external channel estimation apparatus may estimate channel variations based on the input data signal DI and outputs control signals FW1 through FWM and SW1 through SWM. At 705, first OR gates FR1 through FRM may output first filter control signals FC1 through FCM, respectively, in response to the comparison signals FV1 through FVM, respectively, and the control signals FW1 through FWM, respectively, so that at least a portion of the coefficient buffers 165 of the forward filter banks FF1 through FFM may be enabled. The first OR gates SR1 through SRN may output second filter control signals SC1 through SCN, respectively, in response to the comparison signals SV1 through SVN, respectively, and the control signals SW1 through SWN, respectively, such that at least a portion of the coefficient buffers 165 of the feedback filter banks FB1 through FBN may be enabled. At 706, a step size coefficient may be increased or decreased based on the number of coefficient buffers 165 enabled at 705. A coefficient generation circuit 140 (or 440) may receive the first filter control signals FC1 through FCM and the second filter control signals SC1 through SCN, may determine how many coefficient buffers 165 may currently be enabled, and may increase or decrease the step size coefficient based on the determination results. At 707, a determination may be made as to whether a failure has occurred during an equalization operation (e.g., a sparse tap adaptive equalization operation). If a failure has occurred during the equalization operation (e.g., a sparse tap adaptive equalization operation), the method may return to 703, and initiate another round of equalization. Otherwise, the equalization method may return to 701 such that 701 through 706 may be repeated. 704 may be skipped, in which case, the first bank control circuits FFC1 through FFCM may compare the first filtering coefficients CFP1 through CFPM and CFO1 through CFO(M−1) with the threshold value and may output the first filter control signals FC1 through FCM, respectively, and the second bank control circuits FBC1 through FBCN may compare the second filtering coefficients CSP1 through CSPN and CSO1 through CSO(N−1) with the threshold value and may output the second filter control signals SC1 through SCN, respectively.

As described above, coefficient buffers of overlapped filter banks may be selectively enabled, and distortions in filtered signals may be reduced and/or step size may be adjusted.

As described above, the equalizer (e.g., sparse tap adaptive equalizer) and the equalization method (e.g., sparse tap adaptive equalization method) according to example embodiments of the present invention may use an overlapped filter bank structure; which may reduce energy consumption and/or distortions in filtered signals and/or may adjust step size.

Although example embodiments of the present invention have been described with regard to a higher logic value (e.g., a logic value of 'high' or '1'), and a lower logic value (e.g., a logic value of 'low' or '0'), it will be understood that these values may be used interchangeably, and any suitable logic value may be used.

Although example embodiments of the present invention have been discussed with regard to, for example, filtering coefficients comprised of a specific number of bits, it will be understood that any value described herein may be any suitable number of bits.

Although example embodiments of the present invention have been described with regard to OR logic operations and/or gates, it will be understood that any suitable selector or selector circuit may be used (e.g., AND operations and/or gates, XOR operations and/or gates, etc.).

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An equalizer comprising:
    a filter circuit, which has an overlapped filter bank structure, stores at least one of a plurality of filtering coefficients input thereto in response to a plurality of filter control signals, filters an input data signal in response to the at least one stored filtering coefficient, operation data, and slice symbol data, and outputs an output data signal, wherein the filter circuit includes,
        a feedforward filter, which stores at least one of the plurality of filtering coefficients in response to the plurality of filter control signals, filters the input data signal based on the at least one stored filtering coefficient and the operation data, and outputs a first filtering signal,
        a feedback filter, which stores at least one of the plurality of filtering coefficients in response to the plurality of filter control signals, filters the slice symbol data based on the at least one stored filtering coefficient and the operation data, and outputs a second filtering signal, and
        a main adder, which adds the first and second filtering signals and outputs the output data signal, and
        wherein the feedforward filter and the feedback filter include,
            a plurality of filter banks, which at least partially overlap one another, wherein each of the filter banks includes,
                independent filter taps and overlapped filter taps that are shared by a corresponding filter bank and a filter bank adjacent to the corresponding filter bank; and
    a filter control circuit, which compares at least one filtering coefficient stored in the filter circuit with a threshold value and generates the plurality of filter control signals based on the comparison,
        wherein the number of filtering coefficients stored in the filter circuit increases or decreases based on a status of the plurality of filter control signals.

2. The equalizer of claim 1, further including,
    a slicer, which slices the output data signal, outputs a sliced output data signal as the slice symbol data, and determines a voltage level of the output data signal,
    a coefficient generation circuit, which estimates channel variation in response to the input data signal and generates the filtering coefficients and a step size coefficient based on the estimated channel variation, and
    an operation circuit, which generates the operation data based on the output data signal, the slice symbol data, and the step size coefficient.

3. The equalizer of claim 1, wherein the filtering coefficients are updated based on the operation data and the input data signal or operation data and the slice symbol data, and the filter banks perform an operation on the updated filtering coefficients and the input data signal or the updated filtering coefficients and the slice symbol data and output the operation results.

4. The equalizer of claim 1, wherein
    each of the independent filter taps includes,
        a coefficient buffer which is enabled or disabled in response to a corresponding filter control signal and stores a corresponding filtering coefficient when enabled, and each of the overlapped filter taps includes,
a coefficient buffer which is enabled or disabled in response to at least one of a pair of filter control signals and stores a corresponding filtering coefficient when enabled.

5. The equalizer of claim 4, wherein
the coefficient buffers included in each of the filter banks are all enabled or disabled simultaneously in response to a corresponding filter control signal or at least one of a pair of filter control signals.

6. The equalizer of claim 1, wherein
at least a first pair of the filter control signals is applied to at least a first set of two groups of independent filter taps of two adjacent filter banks that share a group of overlapped filter taps.

7. The equalizer of claim 1, wherein the filter control circuit further includes,
at least a first and a second filter control circuit, which compare stored filtering coefficients with the threshold value and generate at least a first and a second filter control signal based on the comparison results.

8. The equalizer of claim 7, wherein,
the first filter control circuit compares at least a first portion of the stored filtering coefficients with the threshold value, and
the second filter control circuit compares at least a second portion of the stored altering coefficients with the threshold value.

9. The equalizer of claim 8, wherein the first and second filter control circuits include,
a plurality of bank control circuits, which compare the filtering coefficients stored in the buffers of each of the filter banks with the threshold value and output comparison signals, and
a plurality of selectors, which output the filter control signals in response to the comparison signals and control signals.

10. The equalizer of claim 9, wherein the control signals are generated based on channel estimation information, which is obtained by an external channel estimation apparatus based on the input data signal.

11. The equalizer of claim 7, wherein,
the first filter control circuit includes a plurality of bank control circuits, which compare at least a first portion of the stored filtering coefficients with the threshold value, and
the second filter control circuit includes a plurality of bank control circuits, which compare at least a second portion of the stored filtering coefficients with the threshold value.

12. The equalizer of claim 11, wherein the plurality of bank control circuits, included in the first filter control circuit, compare first filtering coefficients stored in first and second coefficient buffers of each of the forward filter banks with the threshold value and output first filter control signals based on the comparison results.

13. The equalizer of claim 11, wherein the plurality of bank control circuits, included in the second filter control circuit, compare second filtering coefficients stored in third and fourth coefficient buffers of each of the feedback filter banks with the threshold value and output second filter control signal based on the comparison results.

14. The equalizer of claim 11, wherein,
if at least one of the stored filtering coefficients is greater than the threshold value, a bank control circuit enables a corresponding filter control signal so that coefficient buffers included in a corresponding filter bank are all enabled simultaneously.

15. The equalizer of claim 11, wherein each of the bank control circuits includes,
a first multiplexer, which outputs the stored filtering coefficients stored in each of the filter banks in response to a coefficient selection signal,
a comparator, which compares the filtering coefficients received from the first multiplexer with the threshold value and outputs comparison signals, and
an output circuit, which adds the comparison signals and outputs the corresponding filter control signal in response to an output selection signal.

16. The equalizer of claim 15, wherein the output circuit includes,
a second multiplexer, which selects one of a flag signal and a first buffer signal in response to the output selection signal and outputs the selected signal as the corresponding filter control signal,
a first buffer, which stores the selected signal output from the second multiplexer and outputs the stored signal as the first buffer signal,
an adder, which adds the comparison signals and a second buffer signal and outputs the sum as the flag signal, and
a second buffer, which stores the flag signal and outputs the stored flag signal as the second buffer signal.

17. The equalizer of claim 16, wherein
if the output selection signal is disabled, the second multiplexer selects the first buffer signal and outputs the selected first buffer signal as the corresponding filter control signal,
if the output selection signal is enabled, the second multiplexer selects the flag signal and outputs the selected flag signal as the corresponding filter control signal, and
if the first multiplexer outputs all of the filtering coefficients stored in the coefficient buffers of the corresponding filter bank, the output selection signal is enabled.

18. The equalizer of claim 11, wherein each of the bank control circuits includes,
comparators, which compare the stored filtering coefficients with the threshold value and output a plurality of comparison signals, and
an output circuit, which outputs the corresponding filter control signal in response to the comparison signals.

19. The equalizer of claim 18, wherein,
each of the comparators enables a corresponding comparison signal if one of the stored filtering coefficients is larger than the threshold value,
the output circuit includes an OR gate, which enables a corresponding filter control signal if at least one of the comparison signals is enabled, and
the coefficient buffers of the corresponding filter bank are all enabled simultaneously if the corresponding filter control signal is enabled.

20. An equalization method comprising:
driving a plurality of forward filter banks and a plurality of feedback filter banks;
determining whether an equalization condition is met;
comparing stored filtering coefficients associated with each of the forward filter banks and each of the feedback filter banks with a threshold value and outputting comparison signals if the equalization condition is met;
estimating channel variation using an external channel estimation apparatus and generating control signals as the estimated channel variation;

outputting filter control signals based on the comparison signals and the control signals, enabling coefficient buffers of at least one of the forward filter banks and at least one of the feedback filter banks, and disabling coefficient buffers of the remaining forward filter banks and feedback filter banks;

adjusting step size based on the number of coefficient buffers that are enabled;

repeating the comparing, estimating, outputting, and adjusting until a failure occurs; and repeating the driving, determining, comparing, estimating, outputting, and adjusting if the failure has occurred.

* * * * *